(12) United States Patent
Hanaoka et al.

(10) Patent No.: US 8,879,600 B2
(45) Date of Patent: Nov. 4, 2014

(54) SURFACE EMITTING LASER ARRAY ELEMENT, OPTICAL SCANNING DEVICE, AND IMAGE FORMING APPARATUS

(71) Applicants: Katsunari Hanaoka, Miyagi (JP); Masayuki Numata, Miyagi (JP); Hiroyoshi Shouji, Miyagi (JP)

(72) Inventors: Katsunari Hanaoka, Miyagi (JP); Masayuki Numata, Miyagi (JP); Hiroyoshi Shouji, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/781,975

(22) Filed: Mar. 1, 2013

(65) Prior Publication Data
US 2013/0251408 A1    Sep. 26, 2013

(30) Foreign Application Priority Data

Mar. 9, 2012  (JP) ................................. 2012-052689
Nov. 28, 2012  (JP) ................................. 2012-260156

(51) Int. Cl.
| | | |
|---|---|---|
| H01S 5/00 | (2006.01) |
| B41J 2/45 | (2006.01) |
| B41J 2/455 | (2006.01) |
| B41J 2/47 | (2006.01) |
| H01S 5/022 | (2006.01) |
| G02B 26/10 | (2006.01) |
| G02B 26/12 | (2006.01) |
| H01S 5/42 | (2006.01) |
| H01S 5/187 | (2006.01) |
| H01S 5/343 | (2006.01) |
| H01S 5/183 | (2006.01) |

(52) U.S. Cl.
CPC ................. *H01S 5/187* (2013.01); *B41J 2/473* (2013.01); *H01S 5/3432* (2013.01); *H01S 5/02276* (2013.01); *G02B 26/106* (2013.01); *G02B 26/123* (2013.01); *H01S 5/18311* (2013.01); *H01S 2301/176* (2013.01); *H01S 5/423* (2013.01)
USPC ..................... 372/50.12; 372/50.11; 347/238; 347/233; 347/225

(58) Field of Classification Search
USPC ............ 372/50.11, 50.12; 347/238, 233, 225
See application file for complete search history.

(56) References Cited

U.S. PATENT DOCUMENTS

| 8,089,498 B2 | 1/2012 | Sato et al. |
| 8,275,014 B2 | 9/2012 | Hanaoka |
| 2009/0295902 A1 | 12/2009 | Sato et al. |

(Continued)

FOREIGN PATENT DOCUMENTS

| JP | 2005-191343 | 7/2005 |
| JP | 2006-013366 | 1/2006 |

(Continued)

*Primary Examiner* — Sarah Al Hashimi
(74) *Attorney, Agent, or Firm* — Cooper & Dunham LLP (57) ABSTRACT

A surface emitting laser array element is disclosed that includes a lower distributed bragg reflector (DBR) that is formed on a substrate, an active layer that is formed on the lower DBR, and an upper DBR that is formed on the active layer. A mesa and a dummy mesa that is arranged at a periphery of the mesa are created by removing a portion of the upper DBR. The mesa forms a surface emitting laser, and a wiring is connected to an electrode that is formed on an upper face of the mesa. The wiring includes a portion that is arranged over an upper face of the dummy mesa, a side face of the dummy mesa, and a bottom face at a peripheral region of the dummy mesa extending along a longitudinal direction of the wiring.

10 Claims, 10 Drawing Sheets

(56) References Cited

U.S. PATENT DOCUMENTS

| | | |
|---|---|---|
| 2011/0134500 A1* | 6/2011 | Miyatake et al. .......... 359/204.1 |
| 2011/0211869 A1 | 9/2011 | Shouji et al. |
| 2011/0249696 A1* | 10/2011 | Masui et al. ............... 372/46.01 |
| 2011/0261850 A1 | 10/2011 | Shouji et al. |
| 2011/0304684 A1 | 12/2011 | Numata et al. |
| 2011/0316961 A1 | 12/2011 | Hanaoka |
| 2012/0057902 A1 | 3/2012 | Shouji et al. |

FOREIGN PATENT DOCUMENTS

| | | |
|---|---|---|
| JP | 2007-027362 | 2/2007 |
| JP | 3965801 | 8/2007 |
| JP | 2008-034637 | 2/2008 |
| JP | 4641251 | 3/2011 |
| JP | 2011/148957 A1 | 12/2011 |

* cited by examiner

SURFACE EMITTING LASER ARRAY ELEMENT, OPTICAL SCANNING DEVICE, AND IMAGE FORMING APPARATUS

BACKGROUND OF THE INVENTION

1. Field of the Invention

The disclosures herein generally relate to a surface emitting laser array element, an optical scanning device, and an image forming apparatus.

2. Description of the Related Art

A surface emitting laser array element may be created by integrating plural surface emitting lasers (VCSEL: Vertical Cavity Surface Emitting Lasers). For example, the surface emitting laser array element may be created by forming a semiconductor layer stack by sequentially layering an n-type semiconductor multilayer film reflector, a lower spacer layer, a multiple quantum well active layer, an upper spacer layer, and a p-type semiconductor multilayer reflector on a n-GaAs substrate; forming plural mesas by etching the semiconductor layer stack in the vertical direction; forming an inter-layer insulating film; removing portions of the inter-layer insulating film arranged on the upper faces of the mesas to form openings corresponding to light emitting surfaces; and configuring the light emitting surfaces to emit laser light. It is noted that in such a surface emitting laser array element, upper electrodes are formed on the upper faces of the mesas, and the upper electrodes are connected to electrode pads by wirings that are formed on the inter-layer insulating film. Also, lower electrodes are formed on the rear face of the n-GaAs substrate.

In such a surface emitting laser array element, a current-confined structure is created by forming a semiconductor layer corresponding to a current-confined layer and performing selective oxidization for oxidizing the surrounding area of the current-confined layer. Specifically, to induce crystal growth of the semiconductor layer stack, an AlAs layer (or an AlGaAs layer with an Al composition ratio that is close to 1) as the current-confined layer is formed as part of the upper multilayer film reflector (DBR: Distributed Bragg Reflector) and the mesas are formed so that the side face of the current-confined layer is exposed. Then, steam oxidation is performed to oxidize a part of the current-confined layer from its side face to form a selectively oxidized region made of $Al_xO_y$. In this way, the AlAs region that is not oxidized forms a current-confined window (OA: Oxide Aperture) corresponding to a current-confined region.

The current-confined layer may be an $Al_xGa_yAs_z$ layer containing a small amount of Ga. However, the oxidation speed of the $Al_xGa_yAs_z$ layer largely depends on the amount of Ga contained. Thus, in the case of using $A_xGa_yAs_z$, it may be difficult to control the size of the current-confined region formed at the current-confined layer so that there may be variations in the laser characteristics of the surface emitting lasers and the throughput may be low due to the low oxidation speed. Accordingly, AlAs is preferably used as the material of the current-confined layer.

As can be appreciated from above, in a surface emitting laser having a current-confined structure, the production yield of the surface emitting layer may be improved and the throughput may be improved to thereby reduce manufacturing costs by using AlAs as the current-confined layer.

On the other hand, the current-confined window corresponding to the current-confined region is preferably arranged into a quadrangular shape so that the deflection direction may be controlled. However, the oxidation speed of the AlAs layer is largely dependent on its surface orientation. Thus, to arrange the current-confined region into a quadrangular shape, the mesas need to be arranged into quadrangular prisms or trapezoidal prisms.

The surface emitting laser array element is created by integrating the above surface emitting lasers in a two-dimensional array. For example, surface emitting lasers with mesas of approximately 30 μm² may be arranged two-dimensionally at a pitch of approximately 40 μm to manufacture a densely integrated two-dimensional surface emitting laser array element. By using the surface emitting laser array element manufactured in this manner in the light source of an image forming apparatus such as a laser printer, a high-quality image equivalent to that obtained in offset printing may be output. The surface emitting laser array element may be superior to the edge emitting laser in that it can have plural surface emitting lasers that act as light emitting channels densely integrated into a two-dimensional array.

The mesa forming the surface emitting laser may be created by forming a resist pattern at the region where the mesa is to be formed by applying a photo resist on the semiconductor layer stack, exposing the photo resist with an exposure device, and developing the resist pattern; and then performing dry etching such as PIE (Reactive Ion Etching) on the semiconductor layer stack using the resist pattern as a mask. The above process may be used even in the case of fabricating a densely integrated two-dimensional surface emitting layer array element where the pitch of the surface emitting lasers is no more than 40 μm, for example.

It is noted that reactive ion etching may be advantageous in that it enables microfabrication in the micrometer scale and etching endpoint control in the nanometer scale. However, in this etching technique, the etching rate at the center portion is faster than the etching rate at the peripheral portion so that side etching and over etching may occur at the mesa located at the peripheral portion of the semiconductor layer stack. As a result, variations may be created in the laser characteristics of the surface emitting lasers. Such a problem may be particularly prominent with respect to the surface emitting lasers formed at the outermost region. It is believed that this problem occurs due to the fact that the mesas at the center portion are surrounded by adjacent mesas whereas the mesas at the outer periphery has portions that are not adjacent to any other mesa so that the ratio of the reactive ion to the by-product at these mesas at the outer periphery varies from the other mesas thereby creating variations in the etching rates.

In this respect, Japanese Laid-Open Patent Publication No. 2000-114656 (Patent Document 1) discloses a technique that involves arranging dummy mesas that are not actually used as lasers around mesas used for laser oscillation in order to prevent variations in the etching rate when forming the mesas and to thereby stabilize the process.

It is noted that the AlAs layer corresponding to the current-confined layer formed at the surface emitting laser having the current-confined structure is rather fragile so that it may easily break when pressure is applied thereon. Also, in the case where accommodations are made to avoid breakage of the AlAs layer, the surface emitting laser manufacturing method may become complicated and manufacturing costs may be increased. As a result, advantages such as the high production yield and high throughput of the surface emitting laser having the current-confined structure may be compromised.

Specifically, in a case where a contact exposure device that is small and relatively inexpensive is used as the exposure device in a photolithography process when forming the resist pattern, the pressure of contact of the exposure device with the photo mask during exposure of the same may cause the AlAs layer to break. On the other hand, when the contact pressure of the exposure device is reduced to prevent breakage of the AlAs layer, adhesion of the photo mask may be reduced so that the transcriptional precision of the lithography process may be degraded and the production yield and uniformity of the surface emitting lasers may be compromised, for example.

In this respect, since high transcriptional precision is required in fabricating a surface emitting laser array element having surface emitting lasers densely integrated into a two-dimensional array, the use of the reduced projection exposure method in the photolithography process may be contemplated. However, an exposure device for realizing reduced projection exposure is relatively large and expensive so that the cost for manufacturing the surface emitting lasers may be significantly increased in the case where such exposure device is used, for example.

On the other hand, desirable transcription characteristics may be obtained using the relatively small and inexpensive contact exposure device by arranging dummy mesas around the mesas that are to form the surface emitting lasers and dispersing the contact pressure of the exposure device so that adhesion of the photo mask to the substrate may be increased. That is, by arranging the dummy mesas, the densely integrated two-dimensional surface emitting laser array element with the current-confined structure may be manufactured at a relatively low cost. Japanese Laid-Open Patent Publication No. 2007-27362 (Patent Document 2) discloses such a technique for obtaining desirable transcription characteristics by arranging the dummy mesas and dispersing the contact pressure during contact exposure.

In the case of arranging dummy mesas at the densely integrated two-dimensional surface emitting laser array element around the region where the surface emitting lasers are to be formed, wirings have to be formed above the dummy mesas. However, in this case, the dummy mesas may become obstacles for the wirings because the wirings have to be arranged over the uneven surface created by the dummy mesas. That is, wiring disconnection may occur at the edge portions of the upper faces of the dummy mesas, or the film thickness of the wirings may be reduced to cause an increase in electrical resistance, for example.

The wiring may be created by depositing a metallic material through vacuum vapor deposition or sputtering to form a metal film, for example. In such case, the film thickness of the deposited wiring at the edge of the upper face of the mesa (edge of the concave mesa) and the side face of the mesa may be thinner than the other portions so that wiring disconnection may be prone to occur and the electric resistance of the wiring may be increased at these locations.

Also, in the case where the wiring is formed through vacuum vapor deposition or sputtering, the substrate is typically revolved around its center while the wiring is formed to ensure in-plane uniformity of its film thickness. However, in the case where the mesa has a quadrangular prism shape or a trapezoidal prism shape, the mesa shadows the substrate three-fourths of the film deposition time so that film deposition cannot be performed during this time. Thus, ring disconnection is more prone to occur in this case compared to a case where the mesa has a cylindrical shape or a conical shape.

In this respect, Patent Document 2 discloses forming dummy mesas that are divided into small sections so that the wiring does not have to be arranged over the dummy mesas.

Further, Japanese Laid-Open Patent Publication No. 2008-34637 (Patent Document 3), Japanese Laid-Open Patent Publication No. 2006-13366 (Patent Document 4), Japanese Laid-Open Patent Publication No. 2007-150170 (Patent Document 5), and Japanese Laid-Open Patent Publication No. 2005-191343 (Patent Document 6) disclose techniques for improving the step coverage of the wiring. Specifically, Patent Document 3 discloses covering the entire side face of the mesa with a p-side electrode wiring. Patent Documents 4 and 5 disclose arranging the mesa into a tapered structure in order to improve wiring coverage. Patent Document 6 discloses a planarization technique using polyimide.

Other known methods for improving the step coverage of the wiring formed through vacuum vapor deposition or sputtering include depositing the deposition particles from an oblique angle with respect to the substrate so that the wiring formed at the side wall of the mesa may be thickened.

However, the above disclosures still fail to resolve certain problems and disadvantages. Although Patent Document 1 discloses arranging dummy mesas that are not actually used as lasers around mesas used for laser oscillation to reduce variations in the etching rate for forming the mesas, as described above, in such a configuration, the dummy mesas may become obstacles for the electrode wiring when the mesas forming the surface emitting lasers are densely integrated into a two-dimensional array. That is, when the wiring is formed on the upper surfaces of the dummy mesas, wiring disconnection may occur at the edges of the upper faces of the dummy mesas and the wiring resistance may be increased as a result of the reduced thickness of the wiring.

Although Patent Document 2 discloses forming dummy mesas that are divided into small sections so that the wiring does not have to be arranged over the dummy mesas and the contact pressure may be dispersed by the dummy mesas, in such a configuration, because the shapes of the mesas that are to become the surface emitting lasers are different from the shapes of the dummy mesas, the etching rate during the dry etching process for forming the mesas may not be uniform. Thus, even if the dummy mesas are formed, the problem of variations in the etching rates may not be resolved.

Although Patent Document 3 discloses forming a p-side electrode wiring on all the side wall faces of the mesas to improve step coverage of the wiring, in such a configuration, internal stress of the wiring formed on the mesa side walls may act on the surface emitting lasers to cause lattice defects so that reliability of the surface emitting lasers may be degraded. Also, the deflection direction of emitted laser light may vary from the predetermined direction. Further, in arranging the surface emitting lasers into a two-dimensional array, wiring may be arranged between the mesas that form the surface emitting lasers. However, in the case where such technique is used, the space between the mesas cannot be reduced thereby posing an obstacle to densification of the surface emitting lasers.

Although Patent Documents 4 and 5 disclose arranging the mesas into tapered structures to improve the wiring coverage, such measures are inadequate and the film thickness of the wiring may still be reduced at the mesa side walls (step coverage may be inadequate) so that the occurrence of wiring disconnection and a decrease in reliability may not be effectively prevented.

Also, in the case where the planarization technique disclosed in Patent Document 6 is used, an extra process has to be performed to form the polyimide film so that manufacturing costs may be increased. Further, since the polyimide film comes into contact with the side face of the mesa, internal stress may be generated and the internal stress may act on the surface emitting laser to induce crystal defects and decreased reliability.

Also, in the case of depositing a metallic material from an oblique angle to form the wiring at the side face of the mesa to ensure adequate wiring coverage, a flash may be formed at the edge of the airing arranged at a bottom portion between the mesas. The flash formed at the wiring may turn into particles at a subsequent process and induce a short circuit between wirings. Further, in the case where the substrate is arranged to revolve around its center while deposition particles are deposited from an oblique angle with respect to the substrate in order to ensure uniform in-plane distribution of the wiring film thickness upon forming the wiring, if the mesas are arranged into quadrangular prism shapes, the mesas may shadow the substrate during three-fourths of the film deposition time to thereby prevent film formation during this time. Thus, it may be difficult to improve step coverage of the wiring in this case.

SUMMARY OF THE INVENTION

It is a general object of at least one embodiment of the present invention to provide a surface emitting laser array element that substantially obviates one or more problems caused by the limitations and disadvantages of the related art. It is one particular object of at least one embodiment of the present invention to provide an inexpensive and reliable surface emitting laser array element. It is another particular object of at least one embodiment of the present invention to provide an image forming apparatus that uses the above surface emitting laser array element to stably form a high-resolution high-quality image.

According to one embodiment, a surface emitting laser array element is provided that includes a lower distributed bragg reflector (DBR) that is formed on a substrate, an active layer that is formed on the lower DBR, and an upper DBR that is formed on the active layer. A mesa and a dummy mesa that is arranged at a periphery of the mesa are created by removing a portion of the upper DBR. The mesa forms a surface emitting laser, and a wiring is connected to an electrode that is formed on an upper face of the mesa. The wiring includes a portion that is arranged over an upper face of the dummy mesa, a side face of the dummy mesa, and a bottom face at a peripheral region of the dummy mesa extending along a longitudinal direction of the wiring.

According to an aspect of the present invention, an inexpensive and reliable surface emitting laser array element may be provided. According to another aspect of the present invention, an image forming apparatus that is capable of stably forming a high-resolution high-quality image may be provided.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

In the following, embodiments of the present invention are described with reference to the accompanying drawings. It is noted that certain features and elements shown the drawings that may be identical to each other are given the same reference numerals and their descriptions may be omitted.

[First Embodiment]

(Surface Emitting Laser Array Element)

Figure 1:
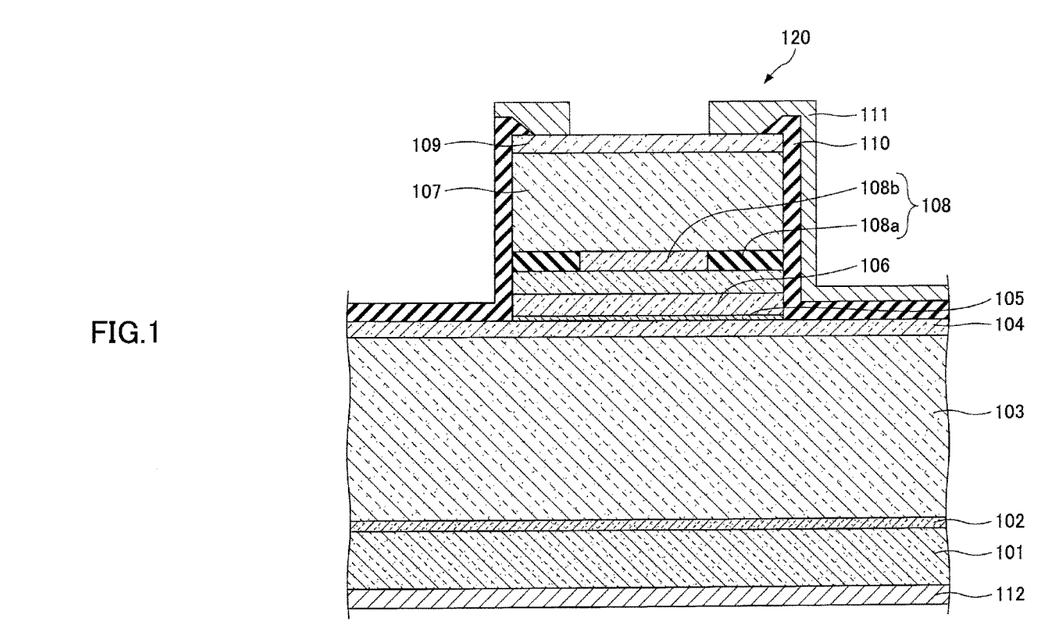
FIG. 1 is a cross-sectional view of a surface emitting laser array element according to a first embodiment of the present invention.

FIG. 1 is a diagram showing a configuration of a surface emitting laser array element according to a first embodiment of the present embodiment. It is noted that the surface emitting laser array element shown in FIG. 1 has an oscillation wavelength in the 780 nm band. Also, it is noted that although FIG. 1 shows only one surface emitting laser, the surface emitting laser array element according to the present embodiment has more than one of such surface emitting lasers arranged into a two-dimensional array.

As is shown in FIG. 1, the surface emitting laser array element according to the present embodiment includes a substrate 101 on which a buffer layer 102, a lower semiconductor DBR (Distributed Bragg Reflector) 103, a lower spacer layer 104, an active layer 105, an upper spacer layer 106, an upper semiconductor DBR 107, a contact layer 109, a dielectric layer 110, and an upper electrode 111 are arranged in this order. Also, a lower electrode 112 is arranged at the rear face of the substrate 101. Further, a current-confined layer 108 is formed at the upper semiconductor DER 107. The current-confined layer 108 includes a selectively oxidized region 108a at the peripheral portion of a mesa 120 and a current-confined region 108b at the center portion that is not oxidized. It is noted that in the present embodiment, the lower semiconductor DBR 103 corresponds to a lower DBR and the upper semiconductor DBR 107 corresponds to an upper DBR.

The substrate 101 is a n-GaAs substrate, and the buffer layer 102 is a n-GaAs layer that is formed on the substrate 101.

The lower semiconductor DBR 103 that is arranged on the buffer layer 102 is formed by alternately layering 40.5 pairs of a low refractive index layer made of $n\text{-}Al_{0.9}Ga_{0.1}As$ and a high refractive index layer made of $n\text{-}Al_{0.3}Ga_{0.7}As$ starting with the low refractive index layer made of $n\text{-}Al_{0.9}Ga_{0.1}As$. Each of these refractive index layers have an optical thickness of $\lambda/4$, where $\lambda$ represents the oscillation wavelength. Also, to reduce electrical resistance between the high refractive index layer and the low refractive index layer, a composition gradient layer with a thickness of 20 nm that has a composition gradually changing from that of one refractive index layer to the other refractive index layer is arranged between the refractive index layers. It is assumed that the film thickness of each of the high refractive index layers and the low refractive index layers includes ½ of its adjoining composition gradient layer. Also, it is noted that when the optical thickness is $\lambda/4$, the actual thickness of the layer is equal to $\lambda/4n$ (where n represents the refractive index of the medium of the corresponding layer).

The lower spacer layer 104 is arranged on the lower semiconductor DBR 103 and corresponds to a non-doped $Al_{0.6}Ga_{0.4}As$ layer.

The active layer 105 is arranged on the lower spacer layer 104 and has a $Al_{0.15}Ga_{0.95}As/Al_{0.3}Ga_{0.7}As$ triple quantum well structure.

The upper spacer layer 106 is arranged on the active layer 105 and corresponds to a non-doped $Al_{0.6}Ga_{0.4}As$ layer.

It is noted that the lower spacer layer 104, the active layer 105, and the upper spacer layer 106 may collectively be referred to as "resonator structure." The optical thickness of the resonator structure is arranged to be equal to one optical wavelength of the resonator structure. It is noted that the active layer 105 is arranged at the center of the resonator structure corresponding to the position an anti-node of the standing wave distribution of the electric field of light so that a high stimulated emission rate may be achieved.

The upper semiconductor DBR 107 that is arranged on the upper spacer layer 106 is formed by alternately layering 25 pairs of a low refractive index layer made of $p-Al_{0.9}Ga_{0.1}As$ and a high refractive index layer made of $p-Al_{0.3}Ga_{0.7}As$. Also, in order to reduce the electrical resistance between the high refractive index layer and the low refractive index layer, a composition gradient layer having a composition that gradually changed from that of one of the refractive index layers to that of the other one of the refractive index layers is arranged between the refractive index layers. The film thickness of each of the high refractive index layers and the low refractive index layers includes ½ of its adjoining composition gradient layer. Also, the optical thickness of each of the refractive index layers is arranged to be $\lambda/4$.

The current-confined layer 108 is formed at one of the low refractive index layers of the upper semiconductor DBR 107. The current-confined layer 108 is made of AlAs, has a thickness of 30 nm, and is inserted where the second low refractive index layer of the second pair of refractive index layers from the upper spacer layer 106 is located.

The contact layer 109 is arranged on the upper semiconductor DBR 107 and is made of p-GaAs.

It is noted that the plural semiconductor layers arranged on the substrate 101 in the manner described above may be referred to as "semiconductor layer stack." Also, it is noted that the upper electrode 111 and a wiring that is connected to the upper electrode 111 are described later.

(Method of Manufacturing the Surface Emitting Laser Array Element)

In the following, a method of manufacturing the surface emitting laser array element according to the present embodiment is described.

First, the buffer layer 102, the lower semiconductor DBR 103, the lower spacer layer 104, the active layer 105, the upper spacer layer 106, the upper semiconductor DBR 107, and the contact layer 109 making up the semiconductor layer stack is created by crystal growth using metal-organic chemical vapor deposition (MOCVD) or molecular beam epitaxy (MBE). For example, in the case where MOCVD is used, trymethylaluminum (TMA), trymethylgallium (TMG), and/or trymethylindium (TMI) may be used as the group III component material, and phosphine ($PH_3$) and/or arsine ($AsH_3$) may be used as the group V component material. Also, carbon tetrabromide ($CBr_4$) and/or dimethylzinc (DMZn) may be used as the p-type dopant material, and hydrogen selenide ($H_2Se$) may be used as the n-type dopant material. It is noted that the film thickness and the number of layers making up each of the above components are described above.

Then, a resist pattern is formed on the contact layer 109. The resist pattern is a square-shaped pattern having a side length of 25 μm that is arranged at the region where the mesa 120 is to be formed. It is noted that the resist pattern is two-dimensionally arranged at plural regions in a manner such that adjacent resist patterns are spaced apart by 15 μm.

Figure 2:
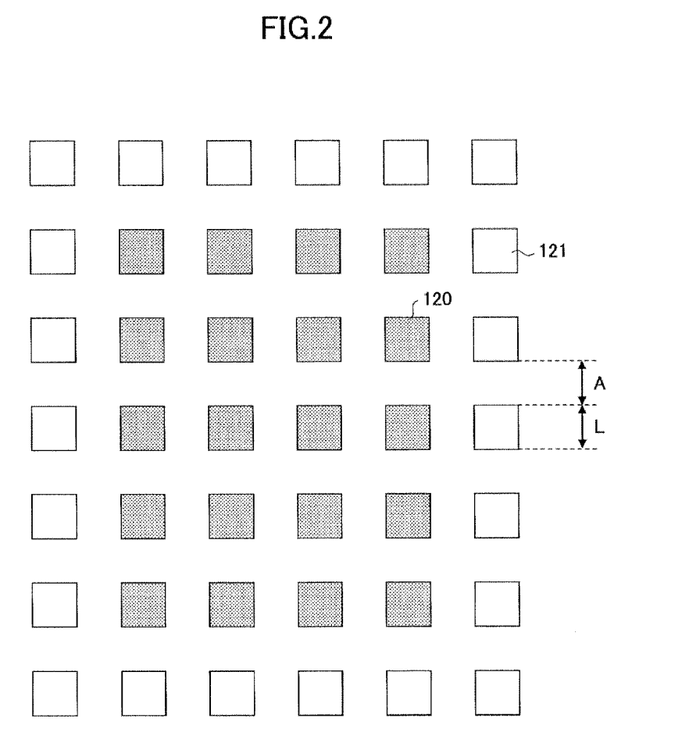
FIG. 2 is a diagram illustrating a process of manufacturing the surface emitting laser array element.

Then, ICP (Inductively Coupled Plasma) dry etching is performed using the resist patterns as masks to form quadrangular prism-shaped mesas 120 and dummy mesas 121 as shown in FIG. 2. In this process, the upper semiconductor DBR 107 at the peripheral regions of the mesas 120 and the dummy mesas 121 are removed. It is noted that the dry etching end point at the periphery of the mesas 120 and dummy mesas 121 is controlled to be near the active layer 105, and the height of the quadrangular prism-shaped mesas 120 and dummy mesas 121 with quadrangular upper faces is arranged to be approximately 3.3 μm.

FIG. 2 is a top view of the mesas 120 and the dummy mesas 121 that are formed by the above dry etching process. At the center portion of FIG. 2, a total of twenty mesas 120 are arranged into a two-dimensional array consisting of five vertical columns and four horizontal rows. Also, the dummy mesas 121 are arranged at the outer peripheral portion surrounding the mesas 120. The mesas 120 and the dummy mesas 121 are arranged into square shapes with a side length (L) of 25 μm, and the space (A) between adjacent mesas 120 and/or dummy mesas 121 is arranged to be 15 μm. In the present embodiment, the shapes of the mesas 120 and the dummy mesas 121 are arranged to be substantially the same, and the mesas 120 and the dummy mesas 121 are arranged into a two-dimensional array.

Then, the resist patterns are removed using an organic solvent, for example.

Then, an oxidation process is performed on the mesa 120. Specifically, the current-confined layer 108 exposed from the side face of the mesa 120 is selectively oxidized from the peripheral edge of the mesa 120. In this way, Al (aluminum) included in the current-confined layer 108 is oxidized and the selectively oxidized region 108a is formed at the peripheral portion of the mesa 120. Also, the center portion of the mesa 120 that is not oxidized becomes the current-confined region 108b. In the current-confined layer 108 including the selectively oxidized region 108a and the current-confined region 108b, a current is prevented from flowing into the selectively oxidized region 108a so that the current only flows into the current-confined region 108b. Thus, the current flowing into the mesa 120 may be confined to the current-confined region 108b at the center portion of the mesa 120 so that a confined current may be supplied to the active layer 105.

After the selective oxidization process is performed on the current-confined layer 108, a device isolation trench is formed. Specifically, a photo resist is applied on the surface of the semiconductor layer stack after which the surface is exposed by an exposure device and developed to form a resist pattern having an opening at the region where the device isolation trench is to be formed. In the above exposure process, a contact exposure device is used and a photo mask is adhered to the surface on which the photo resist is applied upon exposing the surface. Then, dry etching such as ICP etching is performed to remove the semiconductor layers located at the regions where the resist pattern is not formed. In this way, the device isolation trench may be formed. Then, the resist pattern is removed using an organic solvent, for example.

Then, chemical vapor deposition (CVD) is used to form the dielectric layer 110. The dielectric layer 110 may be made of SiN, SiOn, or $SiO_2$, for example. It is noted that the dielectric layer 110 acts as a protective film and may simply be referred to as "protective film" hereinafter.

Then, a portion of the dielectric layer 110 arranged on the upper face of the mesa 120 is removed.

Specifically, a photo resist is applied on the dielectric layer 110 after which the surface is exposed by an exposure device and developed so that a resist pattern having an opening at the upper face of the mesa 120 is formed. In the above exposure process, the contact exposure device is used and a photo mask is adhered to the surface on which the photo resist is applied upon exposing the surface. Then BHF (buffered HF or buffered oxide etch) is used to remove a portion of the dielectric layer 110 that is exposed from the opening of the resist pattern so that the surface of the contact layer 109 may be exposed. It is noted that in this process, the dielectric layer 110 formed at the device isolation trench is also removed.

Figure 4:
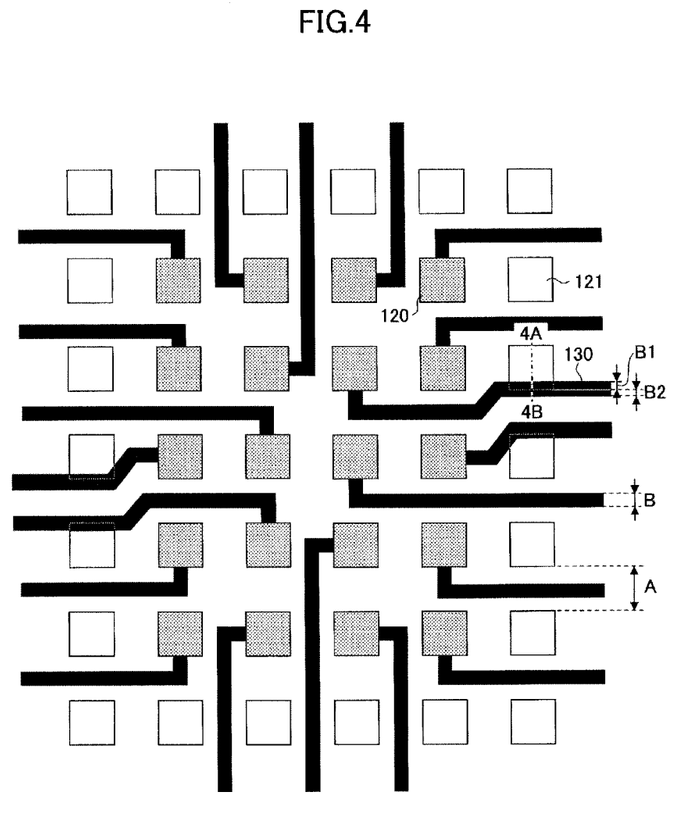
FIG. 4 is a top view of the surface emitting laser array element according to the first embodiment.

Then, the upper electrode 111 corresponding to the p-side electrode and a wiring 130 as shown in FIG. 4 are formed. Specifically, a photo resist is applied on the surface of the dielectric layer 110 after which the surface is exposed by an exposure device and developed to form a resist pattern having openings at the regions where the upper electrode 111 and the wiring 130 are to be formed. In the above exposure process, a contact exposure device having a mercury lamp is used and a photo mask is adhered to the surface on which the photo resist is applied upon exposing the surface. The resist pattern has openings at the regions where the upper electrode 111 and the wiring 130 are to be formed. The wiring 130 has a width of 7.0 μm and includes a portion that is formed over the upper face of the dummy mesa 121, the side face of the dummy mesa 121, and a bottom face at a peripheral region of the dummy mesa 121. The openings of the resist pattern include a region for forming such portion of the wiring 130.

Then, a metal film is formed through vacuum vapor deposition to create the upper electrode 111 corresponding to the p-side electrode and the wiring 130. In the present embodiment, a Ti/Pt/Au multilayer film is used as the metal film for creating the upper electrode 111 and the wiring 130.

Then, the metal film arranged over the resist pattern and the resist pattern are immersed in an organic solvent so that they may be selectively removed by a liftoff process. In this way, the upper electrode 111 corresponding to the p-side electrode and the wiring 130 may be created.

Figure 3:
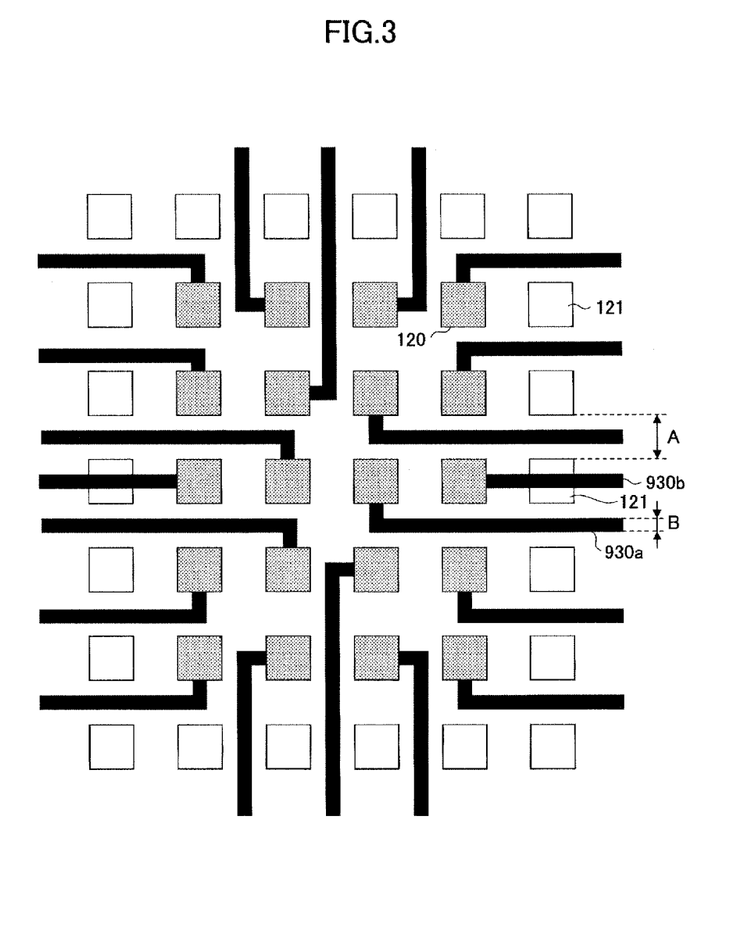
FIG. 3 is top view of a surface emitting laser array element according to a comparative example.

FIG. 3 shows a configuration of a surface emitting laser array element according to a comparative example. In FIG. 3, the space (A) between the mesas 120 (and/or dummy mesas 121) is arranged to be 15 μm, and a wiring 930a is arranged between the mesas 120. In a contact exposure process for creating the wiring 930a of this comparative example, since the upper semiconductor DBR 107 is removed from the space between the mesas 120 (and/or dummy mesas 121), the photo mask is located some distance away from the bottom face at the peripheral region of the mesa 120 (or dummy mesa 121). Because of this, an image to be formed by the exposure process may be blurred, thereby making it difficult to create intricate wiring. That is, the wiring 930a may not be formed at a desired width (B). Also, assuming the wiring 930a had the width B, the space A between the mesas 120 cannot be smaller than the width B. In a case where the space A between the mesas 120 is narrowed in order to densify the surface emitting laser array, a wiring 9306 that goes over the dummy mesa 121 (i.e, across one side face, the upper face, and the other side face of the dummy mesa 121) has to be formed as is shown in FIG. 3. However, as described above, such a wiring 930b is not desired since wiring disconnection may occur at the edge portion of the upper face of the dummy mesa 121.

Figure 5:
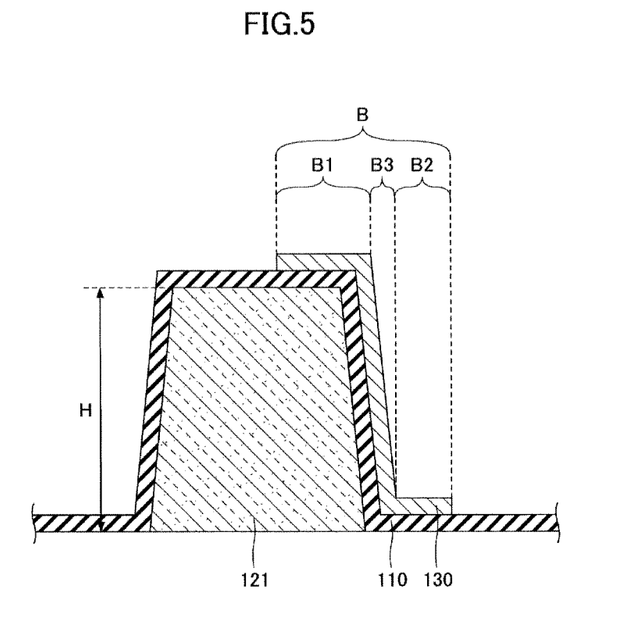
FIG. 5 is a cross-sectional view of a dummy mesa.

In the present embodiment, as is shown in FIGS. 4 and 5, the wiring 130 near the dummy mesa 121 is arranged over the upper face of the dummy mesa 121, the side face of the dummy mesa 121, and the bottom face at the peripheral region of the dummy mesa 121. Specifically, the wiring 130 near the dummy mesa 121 is arranged over the upper face of the dummy mesa 121, the side face of the dummy mesa 121, and the bottom face at the peripheral region of the dummy mesa 121 extending along the longitudinal direction of the wiring (i.e., current flow direction). By arranging the wiring 130 in this manner, the space A between the mesas 120 (and/or dummy mesas 121) may be reduced to enable densification of the surface emitting laser array. In other words, the wiring 130 is configured such that it may not interfere with the densification of the surface emitting lasers. In one preferred embodiment, two strips of wiring may be arranged between the dummy mesas 121 to realize further densification of the surface emitting lasers.

In the present embodiment, the width B of the wiring 130 is arranged to be 7.0 μm, the width B1 of the portion of the wiring 130 arranged over the upper face of the dummy mesa 121 is 3.0 μm, and the width B2 of the portion of the wiring 130 arranged over the bottom face at the peripheral region of the dummy mesa 121 is 4.0 μm. That is, the width B2 is preferably arranged to be wider than the width B1 (B1<B2). In this way, even when the space A between the mesas 120 is reduced, a portion of the wiring 130 may be formed at the bottom face at the peripheral region of the dummy mesa 121 so that defects such as wiring disconnection may be prevented.

FIG. 5 is a cross-sectional view of the dummy mesa 121 across section 4A-4B of FIG. 4. In the present embodiment, the height (H) of the dummy mesa 121 is arranged to be 3.3 μm, and the mesa 120 is arranged to have the same height. Also, it is noted that the width B of the wiring 130 is equal to the sum of the width 61 of the portion of the wiring 130 arranged over the upper face of the dummy mesa 121, the width 62 of the portion of the wiring 130 arranged over the bottom face at the peripheral region of the dummy mesa 121, and a width B3 arranged over the side face of the dummy mesa 121. However, because the width B3 is quite narrow compared to the widths B1 and B2, the width B3 is omitted in FIG. 4.

Figure 6:
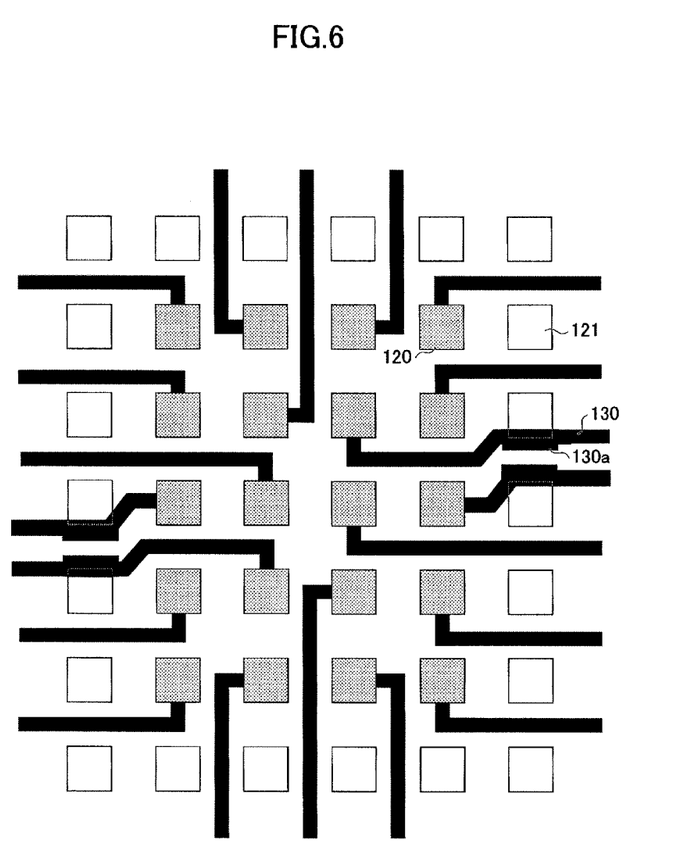
FIG. 6 is a top view of a surface emitting laser array element according to a modified embodiment.

FIG. 6 shows a modified configuration of the surface emitting laser array element according to the present embodiment. In FIG. 6, the wiring 130 includes a portion 130a that is wider than the rest of the portions. The width of the portion 130a may extend in the outward direction from the periphery of the dummy mesa 121. In this way, the risk of wiring disconnection may be reduced even if a deviation occurs in the positioning of the wiring 130 in a photolithography process for forming the wiring 130, for example. That is, by increasing the width of the portion 130a of the wiring 130 in consideration of the positioning accuracy of the photolithography process, the risk of wiring disconnection due to positional deviations may be reduced.

Then, after polishing the rear face of the substrate 101 to a predetermined thickness (e.g., approximately 100 μm), the lower electrode 112 corresponding to the n-side electrode is formed. In the present embodiment, the lower electrode 112 corresponding to the n-side electrode is made of an AuGe/Ni/Au multilayer film.

Then, an annealing process is performed to realize ohmic conduction between the upper electrode 111 corresponding to the p-side electrode and the lower electrode 112 corresponding to the n-side electrode. In this way, surface emitting lasers may be formed at the regions where the mesas 120 are formed.

Then, the semiconductor layer stack is diced into individual chips through scribing and breaking, and other subsequent processes are performed to manufacture the surface emitting laser array element according to the present embodiment. It is noted that in one experiment, 3000 surface emitting laser array elements of the present embodiment were manufactured according to the above manufacturing method, and tests were conducted to confirm successful light emission by all of these surface emitting laser array elements. Further, their output characteristic measurements revealed that wiring disconnection has not occurred in any of these surface emitting laser array elements.

[Second Embodiment]

In the following, a laser printer 1000 is described as a second embodiment of the present invention. The laser printer 1000 described below is an embodiment of an optical scanning device and an image forming apparatus that uses the above surface emitting laser array element according to the first embodiment.

Figure 7:
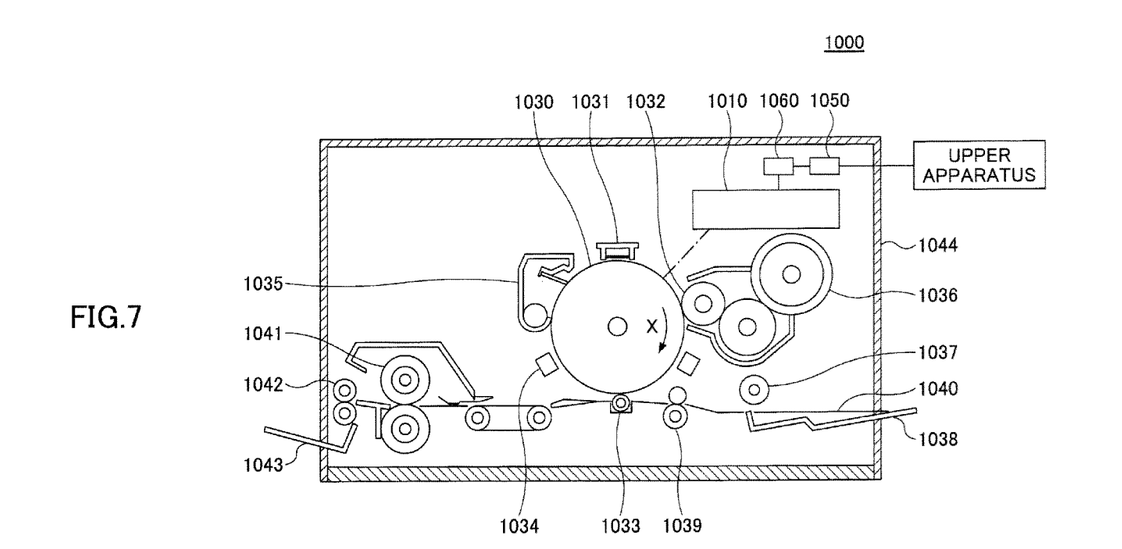
FIG. 7 is a diagram showing a configuration of a laser printer according to a second embodiment of the present invention.

FIG. 7 is a diagram showing an exemplary configuration of the laser printer 1000 according to the present embodiment. The laser printer 1000 includes an optical scanning device 1010, a photosensitive drum 1030, an electrostatic charger 1031, a developing roller 1032, a transfer charger 1033, a neutralizing unit 1034, a cleaning unit 1035, a toner cartridge 1036, a paper feed collar 1037, a paper feed tray 1038, a pair of resist rollers 1039, a fixing roller 1041, a paper delivery roller 1042, a paper delivery tray 1043, a communication control unit 1050, and a printer control unit 1060 that controls the operations of the above units. It is noted that the above units are accommodated within a printer housing 1044.

The communication control unit 1050 controls bidirectional communications between the laser printer 1000 and an upper apparatus (e.g., personal computer) via a network, for example.

The photosensitive drum 1030 is a cylindrical member that has a photosensitive layer arranged on its surface. That is, the surface of the photosensitive drum 1030 corresponds to a scanning surface. The photosensitive drum 1030 is configured to be rotated in the direction of arrow X shown in FIG. 7.

The electrostatic charger 1031, the developing roller 1032, the transfer charger 1033, the neutralizing unit 1034, and the cleaning unit 1035 are arranged near the surface of the photoconductive drum 1030. That is, the electrostatic charger 1031, the developing roller 1032, the transfer charger 1033, the neutralizing unit 1034, and the cleaning unit 1035 are arranged in this order along the rotating direction of the photoconductive drum 1030.

The electrostatic charger 1031 is configured to evenly charge the surface of the photosensitive drum 1030.

The optical scanning device 1010 scans a light beam that is modulated based on image information from the upper apparatus on the surface of the photosensitive drum 1030 that is electrostatically charged by the electrostatic charger 1031. In this way, the optical scanning device 1010 forms a latent image corresponding to the image information on the surface of the photosensitive drum 1030. The latent image formed in this manner is moved in the direction towards the developing roller 1030 through the rotation of the photosensitive drum 1030. It is noted that the configuration of the optical scanning device 1010 is described below.

The toner cartridge 1036 is configured to store toner that is to be supplied to the developing roller 1032.

The developing roller 1032 is configured to develop the latent image formed on the photosensitive drum 1030 into a toner image by attaching toner from the toner cartridge 1036 on the surface of the photosensitive drum 1030. The toner image formed on the surface of the photosensitive drum 1030 is moved towards the transfer charger 1033 through the rotation of the photosensitive drum 1030.

The paper feed tray 1038 is configured to accommodate recording paper 1040. The paper feed collar 1037 is arranged near the paper feed tray 1038 and is configured to extract the recording paper 1040 one sheet at a time from the paper feed tray 1038 and transport the recording paper 1040 to the pair of resist rollers 1039. The resist rollers 1039 are configured to temporarily hold the recording paper 1040 extracted by the paper feed collar 1037 and deliver the recording paper 1040 between the photosensitive drum and the transfer charger 1033 in accordance with the rotation of the photosensitive drum 1030.

A voltage of an opposite polarity from that of the toner is applied to the transfer charger 1033 so that the toner on the surface of the photosensitive drum 1030 may be electrically attracted to the recording paper 1040. In this way, the toner image formed on the surface of the photosensitive drum 1030 may be transferred to the recording paper 1040. Then, the recording paper 1040 having the toner image transferred thereon is transported to the fixing roller 1041.

The fixing roller 1041 applies heat and pressure to the recording paper 1040 so that the toner image may be fixed on the recording paper 1040. Then, the recording paper 1040 having the toner image fixed thereon is delivered to the paper delivery tray 1043 via the paper delivery roller 1042. In this way, sheets of recording paper 1040 having images recorded thereon may be successively delivered and stacked on the paper delivery tray 1043.

The neutralizing unit 1034 is configured to neutralize the surface of the photosensitive drum 1030.

The cleaning unit 1035 is configured to remove residual toner remaining on the surface of the photosensitive drum 1030. Then, the surface of the photosensitive drum 1030 that has been cleaned by the cleaning unit 1035 moves back to a position facing the electrostatic charger 1031.

Figure 8:
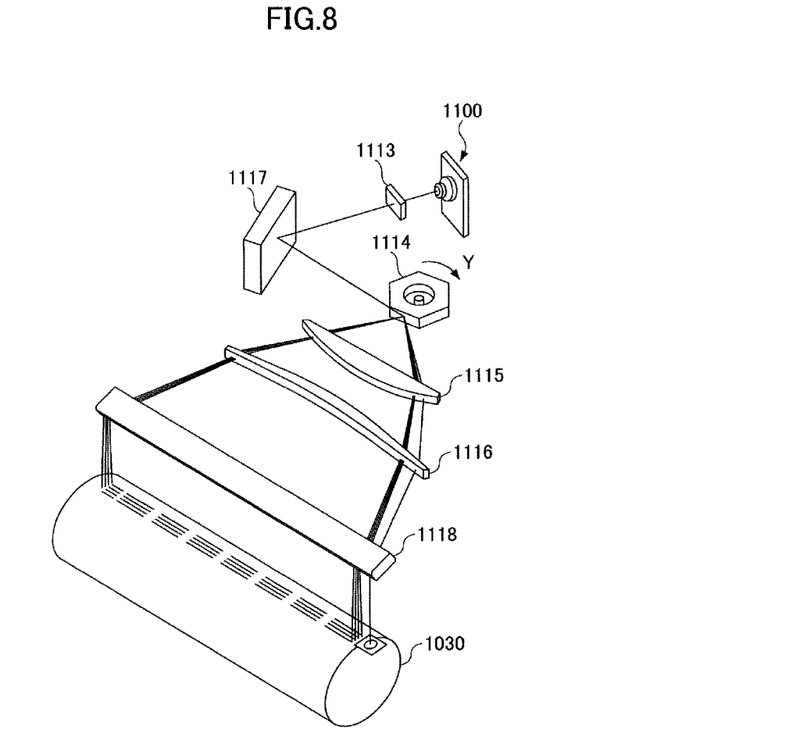
FIG. 8 is a diagram showing a configuration of an optical scanning device according to the second embodiment.

In the following, a configuration of the optical scanning device 1010 is described with reference to FIG. 8. The optical scanning device 1010 includes a light source unit 1100, a coupling lens (not shown), an aperture plate (not shown), a cylindrical lens 1113, a polygon mirror 1114, an fθ lens 1115, a toroidal lens 1116, two mirrors 7, 1118, and a scanning control unit (not shown) that controls the operations of the above units. It is noted that the light source unit 1100 includes the surface emitting laser array element of the first embodiment.

The cylindrical lens 1113 is configured to focus the light output from the light source unit 1100 near a deflection surface of the polygon mirror 1114 via the mirror 1117.

The polygon mirror (optical deflection unit) 1119 is a low-height regular hexagonal prism shaped member that has six deflection surfaces arranged at its side walls. The polygon mirror 1119 is rotated by a rotating mechanism (not shown) in the direction of arrow Y at a constant angular velocity.

In this way, the light output from the light source unit 1100 and focused near a deflection surface of the polygon mirror 1114 by the cylindrical lens 1113 is deflected at a constant angular velocity by the rotation of the polygon mirror 1114.

The fθ lens 1115 has an image height that is proportional to the angle of incidence of the light from the polygon mirror 1114. The fθ lens 1115 is configured to move the image surface of the light deflected at the constant angular velocity by the polygon mirror 1114 in the main scanning direction at a constant velocity. The toroidal lens 1116 is configured to focus the light from the fθ lens 1115 on the surface of the photoconductive drum 1030 via the mirror 118 to form an image on the surface of the photoconductive drum 1030.

The toroidal lens 1116 is arranged on the optical path of the light flux that has passed the fθ lens 1115. The light flux that has passed the toroidal lens 1116 is irradiated on the surface of the photoconductive drum 1030 to form a light beam spot. The light beam spot moves in the longitudinal direction of the photosensitive drum 1030 in accordance with the rotation of the polygon mirror 1114. In other words, the light beam spot scans the surface of the photoconductive drum 1030. It is noted that the moving direction of the light beam spot corresponds to the "main scanning direction" and the rotating direction of the photoconductive drum 1030 corresponds to the "sub scanning direction."

The optical system arranged on the optical path between the polygon mirror 1114 and the photoconductive drum 1030 may be referred to as "scanning optical system." In the present embodiment, the scanning optical system includes the fθ lens 1115 and the toroidal lens 1116. In one embodiment, at least one reflection or may be arranged along the optical path between the fθ lens 1115 and the toroidal lens 116 and/or the optical path between the toroidal lens 116 and the photoconductive drum 1030.

Figure 9:
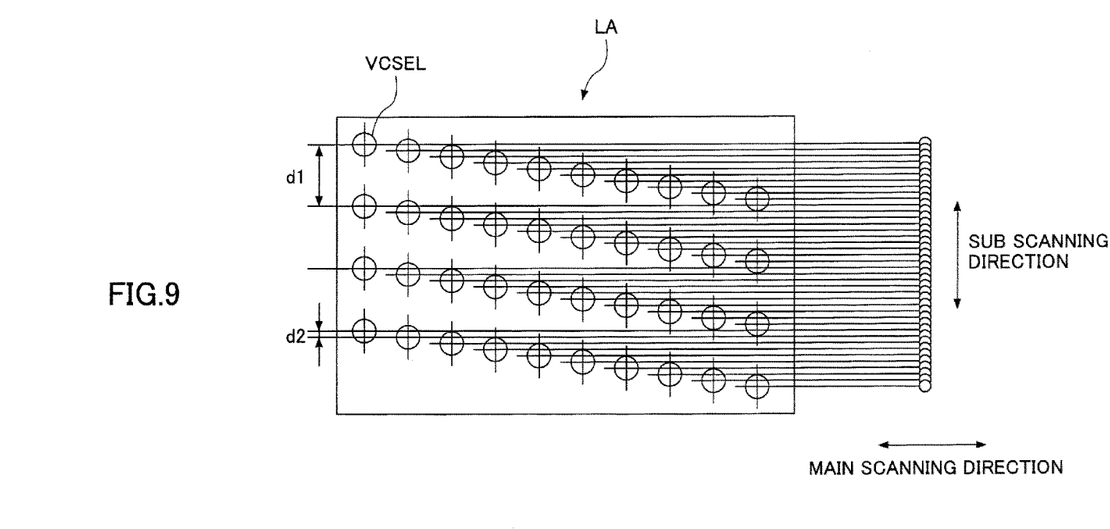
FIG. 9 is a diagram showing a surface emitting laser array element used in the laser printer of the second embodiment.

The light source unit 1100 may include a surface emitting laser array LA having a two-dimensional arrangement as shown in FIG. 9. The surface emitting laser array LA has plural surface emitting laser elements (VCSEL) arranged in a manner such that the centers of the surface emitting laser elements are disposed at equal intervals (d2) in the sub scanning direction. Thus, by adjusting the turn-on timing of the individual surface emitting laser elements, the same effect can be obtained as when light sources are arranged above the photosensitive drum 901 at equal intervals in the sub scanning direction. For example, when the surface emitting laser elements have a pitch d1 of 26.5 μm in the sub scanning direction, the interval d2 is 2.65 μm. When the optical system has a magnifying power of 2, written dots can be formed on the photosensitive drum 1030 at 5.3 μm intervals in the sub scanning direction. This corresponds to a high-density writing of 4800 dpi (dots per inch). Printing at even higher resolutions to produce a higher quality image may be achieved by increasing the number of the surface emitting laser elements in the main scanning direction, reducing the pitch d1 and the interval d2, or reducing the magnifying power of the optical system, for example. It is noted that the write intervals in the main scanning direction can be easily controlled by controlling the turn-on timings of the light sources.

In this case, because the surface emitting laser elements can generate a high single fundamental transverse-mode output even when the written-dot density increases, the laser printer 1000 may print the high density image without decreasing its printing speed. In other words, when the written-dot density is the same, the printing speed may be further increased.

It is noted that although the laser printer 1000 has been described above as an exemplary embodiment of an image forming apparatus of the present invention. The present invention is not limited to such an embodiment.

For example, the present invention may be embodied in an image forming apparatus that is configured to irradiate laser light directly on a medium (e.g., paper) that develops color from the laser irradiation.

In another example, the present invention may be embodied in an image forming apparatus using a silver-salt film as an image carrier, for example. In this case, a latent image may be formed on the silver-salt film by optical scanning, and the latent image may be visualized by a process similar to a developing process performed in a typical silver salt photographic process. Then, the image may be transferred to a printing paper by performing a process similar to the printing process in the typical silver salt photographic process. Such an image forming apparatus may include an optical photoengraving apparatus and an optical drawing apparatus capable of drawing a CT scan image, for example.

According to an aspect of the second embodiment, by using the surface emitting laser array element of the first embodiment, the optical scanning device 1010 may stably form a high-quality latent image. Also, by using the surface emitting laser array element of the first embodiment, the laser printer 1000 may stably form a high-quality image.

[Third Embodiment]

In the following, a color printer 2000 having plural photosensitive drums is described as a third embodiment of the present invention.

Figure 10:
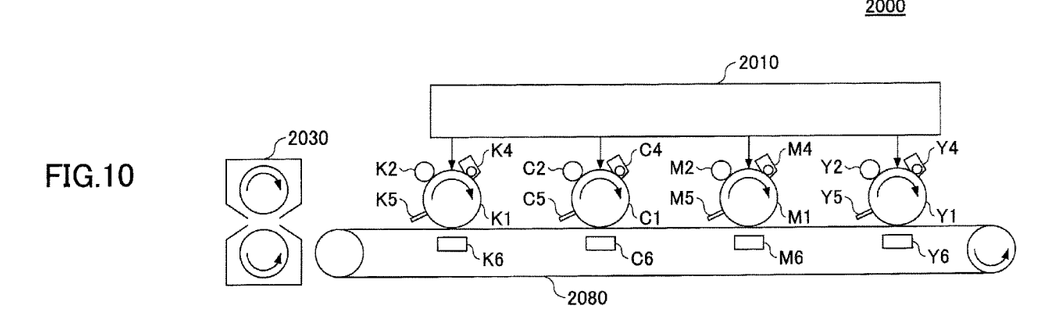
FIG. 10 is a diagram showing a configuration of a color printer according to a third embodiment of the present invention.

FIG. 10 is a diagram showing an exemplary configuration of the color printer 2000. The color printer 2000 is a tandem-type multicolor printer that forms a full color image by superposing four colors (black, cyan, magenta, and yellow). The color printer 2000 includes a black image forming station (including a photosensitive drum K1, a charging device K2, a developing device K4, a cleaning unit K5, and a transfer device K6); a cyan image forming station (including a photosensitive drum C1, a charging device C2, a developing device C4, a cleaning unit C5, and a transfer device C6); a magenta image forming station (including a photosensitive drum M1, a charging device M2, a developing device M4, a cleaning unit M5, and a transfer device M6); a yellow image forming station (including a photosensitive drum Y1, a charging device Y2, a developing device Y4, a cleaning unit Y5, and a transfer device Y6); an optical scanning device 2010; a transfer belt 2080, and a fixing unit 2030, for example.

The photosensitive drums K1, C1, M1, and Y1 (simply referred to as "photosensitive drums" hereinafter) are each configured to rotate in the direction of their corresponding arrows shown in FIG. 10. The charging devices K2, C2, M2, and Y2 (simply referred to as "charging devices" hereinafter); the developing devices K4, C4, M4, and Y4 (simply referred to as "developing devices" hereinafter); the transfer devices K6, C6, M6, and Y6 (simply referred to as "transfer devices" hereinafter); and the cleaning units K5, C5, M5, and Y5; are arranged in this order around the periphery of their corresponding photosensitive drums. The charging devices are configured to evenly charge the surfaces of their corresponding photosensitive drums. The optical scanning device 2010 is configured to irradiate light on the surfaces of the photoconductive drums that are charged by the charging devices to form latent images on the photoconductive drums. The developing devices are configured to form toner images on the surfaces of their corresponding photoconductive drums. The transfer devices are configured to transfer the toner images on recording paper that is disposed on the transfer belt 2080, and the fixing unit 2030 is configured to fix the transferred toner images on the recording paper.

The optical scanning device 2010 has a light source unit that includes the surface emitting laser array element of the first embodiment for each color. The optical scanning device 2010 is configured to realize functions and effects similar to those of the optical scanning device 1010 according to the second embodiment. The color printer 2000 includes the optical scanning device 2010 and therefore realizes functions and effects similar to those of the laser printer 1000 according to the second embodiment.

Further, the present invention is not limited to these embodiments, and numerous variations and modifications may be made without departing from the scope of the present invention.

The present application is based on and claims priority to Japanese Patent Application No. 2012-052689 filed on Mar. 9, 2012, and Japanese Patent Application No. 2012-260156 filed on Nov. 28, 2012, the entire contents of which are hereby incorporated by reference.

What is claimed is:

1. A surface emitting laser array element comprising:
   a lower distributed bragg reflector that is formed on a substrate;
   an active layer that is formed on the lower distributed bragg reflector;
   an upper distributed bragg reflector that is formed on the active layer;
   a mesa and a dummy mesa that are created by removing a portion of the upper distributed bragg reflector, the mesa forming a surface emitting laser and the dummy mesa being arranged at a periphery of the mesa; and
   a wiring that is connected to an electrode that is formed on an upper face of the mesa, the wiring including a portion that is arranged over an upper face of the dummy mesa, a side face of the dummy mesa, and a bottom face at a peripheral region of the dummy mesa extending along a longitudinal direction of the wiring.

2. The surface emitting laser array element as claimed in claim 1, wherein two strips of the wiring are arranged between the dummy mesas.

3. The surface emitting laser array element as claimed in claim 1, wherein
   the portion of the wiring that is arranged over the peripheral region of the dummy mesa is arranged to extend in an outward direction from the dummy mesa to be wider than a remaining portion of the wiring.

4. The surface emitting laser array element as claimed in claim 1, wherein the mesas are arranged into a two-dimensional array.

5. The surface emitting laser array element as claimed in claim 1, wherein the mesa and the dummy mesa are arranged into substantially the same shape.

6. The surface emitting laser array element as claimed in claim 1, wherein the mesa is arranged into a quadrangular shape.

7. The surface emitting laser array element as claimed in claim 1, wherein
   the electrode arranged on the upper face of the mesa includes an upper electrode; and
   the wiring and the upper electrode are created by forming a resist pattern through contact exposure, forming a metal film, and selectively removing the metal film by a liftoff process.

8. The surface emitting laser array element as claimed in claim wherein a first width of a first portion of the wiring that is arranged over the bottom face at the peripheral region of the dummy mesa is wider than a second width of a second portion of the wiring that is arranged on the upper face of the dummy mesa.

9. An optical scanning device that scans light on a scanning surface, the optical scanning device comprising:
   a light source having a surface emitting laser array element;
   a light deflection unit that deflects light from the light source; and
   an optical scanning system that focuses the light deflected by the light deflection unit on the scanning surface; wherein the surface emitting laser array element includes
   a lower distributed bragg reflector that is formed on a substrate;
   an active layer that is formed on the lower distributed bragg reflector;
   an upper distributed bragg reflector that is formed on the active layer;
   a mesa and a dummy mesa that are created by removing a portion of the upper distributed bragg reflector, the mesa forming a surface emitting laser and the dummy mesa being arranged at a periphery of the mesa; and
   a wiring that is connected to an electrode that is formed on an upper face of the mesa, the wiring including a portion that is arranged over an upper face of the dummy mesa, a side face of the dummy mesa, and a bottom face at a peripheral region of the dummy mesa extending along a longitudinal direction of the wiring.

10. An image forming apparatus comprising:
   an image carrier; and
   an optical scanning device that scans light that is modulated according to image information on the image carrier, the optical scanning device including a light source having a surface emitting laser array element, a light deflection unit that deflects light from the light source, and an optical scanning system that focuses the light deflected by the light deflection unit on the scanning surface; wherein the surface emitting laser array element includes
   a lower distributed bragg reflector that is formed on a substrate;
   an active layer that is formed on the lower distributed bragg reflector;
   an upper distributed bragg reflector that is formed on the active layer;
   a mesa and a dummy mesa that are created by removing a portion of the upper distributed bragg reflector, the mesa forming a surface emitting laser and the dummy mesa being arranged at a periphery of the mesa; and
   a wiring that is connected to an electrode that is formed on an upper face of the mesa, the wiring including a portion that is arranged over an upper face of the dummy mesa, a side face of the dummy mesa, and a bottom face at a peripheral region of the dummy mesa extending along a longitudinal direction of the wiring.

* * * * *